United States Patent
Lin et al.

(10) Patent No.: US 6,719,885 B2
(45) Date of Patent: Apr. 13, 2004

(54) METHOD OF REDUCING STRESS INDUCED DEFECTS IN AN HDP-CVD PROCESS

(75) Inventors: Chun-Sheng Lin, Tainan (TW); Jui-Hei Huang, Tainan (TW); Chi-Sheng Lo, Tainan (TW); Long-Siang Chuang, Tainan (TW)

(73) Assignee: Taiwan Semiconductor Manufacturing Co. Ltd., Hsin Chu (TW)

( * ) Notice: Subject to any disclaimer, the term of this patent is extended or adjusted under 35 U.S.C. 154(b) by 0 days.

(21) Appl. No.: 10/087,344

(22) Filed: Mar. 1, 2002

(65) Prior Publication Data

US 2003/0165632 A1 Sep. 4, 2003

(51) Int. Cl.[7] .......................... C23C 14/34; C23C 8/00; B05D 3/02
(52) U.S. Cl. ............... 204/192.32; 427/585; 427/255.7; 427/398.4; 427/402; 427/372.2; 427/379; 427/374.1; 427/374.2
(58) Field of Search .................. 204/192.3, 192.32; 427/585, 255.4, 398.7, 402, 372.2, 379, 374.1, 374.2

(56) References Cited

U.S. PATENT DOCUMENTS

| | | | | |
|---|---|---|---|---|
| 5,968,610 A | * | 10/1999 | Liu et al. | 427/579 |
| 6,335,288 B1 | * | 1/2002 | Kwan et al. | 438/694 |
| 6,365,015 B1 | * | 4/2002 | Shan et al. | 204/192.3 |

* cited by examiner

*Primary Examiner*—Steven H. VerSteeg
(74) *Attorney, Agent, or Firm*—Tung & Associates

(57) ABSTRACT

A method of reducing stress induced defects in a substrate according to an HDP-CVD process including providing a substrate for depositing a layer of material according to an HDP-CVD process; igniting a plasma for carrying out an HDP-CVD process; adjusting plasma operating parameters to achieve a first deposition-sputter ratio with respect to the substrate; depositing a first portion of the layer of material according to a first range of substrate temperatures; and, depositing at least a second portion of the layer of material according to at least a second range of substrate temperatures.

20 Claims, 1 Drawing Sheet

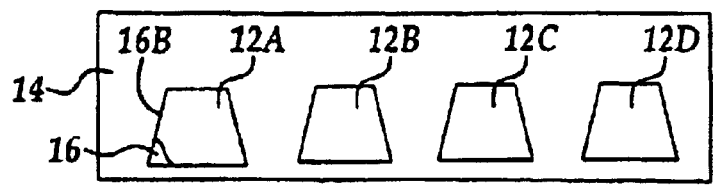
Figure 1A
Prior Art
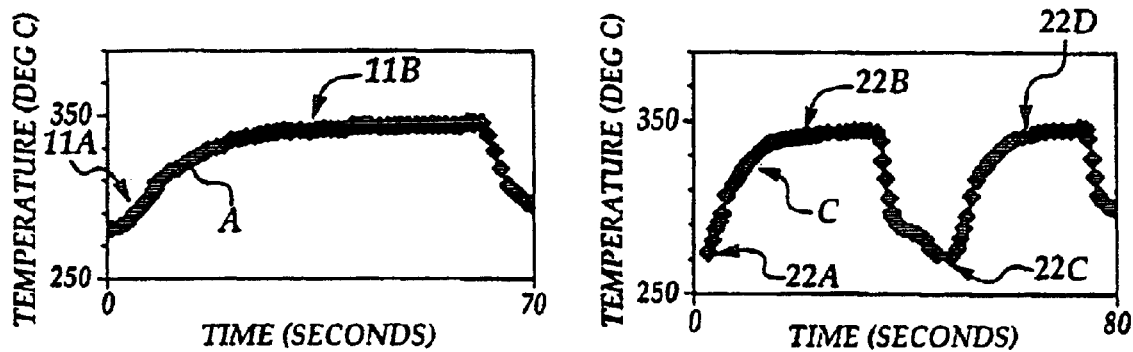
Figure 1B
Prior Art
Figure 2A
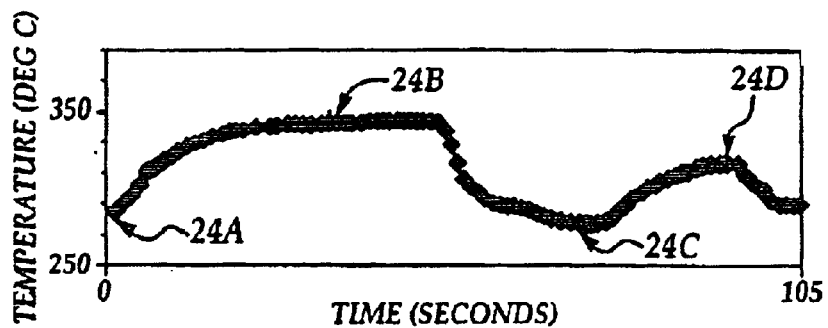
Figure 2B
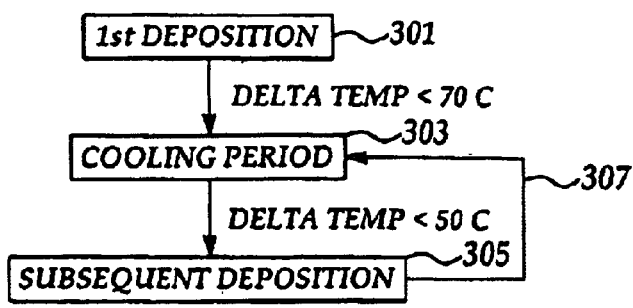
Figure 3

METHOD OF REDUCING STRESS INDUCED DEFECTS IN AN HDP-CVD PROCESS

FIELD OF THE INVENTION

This invention generally relates to HDP-CVD deposition processes and more particularly to a method for reducing stress induced defects present in a semiconductor wafer following an HDP-CVD process.

BACKGROUND OF THE INVENTION

In semiconductor fabrication, various layers of insulating material, semiconducting material and conducting material are formed to produce a multilayer semiconductor device. The layers are patterned to create features that taken together, form elements such as transistors, capacitors, and resistors. These elements are then interconnected to achieve a desired electrical function, thereby producing an integrated circuit (IC) device. The formation and patterning of the various device layers may be accomplished using various fabrication techniques including oxidation, implantation, deposition, epitaxial growth of silicon, lithography, etching, and planarization.

As devices become smaller and integration density increases, the high density plasma chemical vapor deposition (HDP-CVD) process has become a key process due to its gap-filling capability. In particular, high density plasma (HDP) processes, such as electron cyclotron resonance (ECR) processes and induced coupling plasma (ICP) processes have been found to produce high-quality silicon dioxide and silicon nitride layers. Generally, HDP-CVD provides a high density of low energy ions resulting in higher quality films at lower deposition temperatures, compared to for example, PECVD. HDP-CVD is particularly ideal for forming interlayer dielectric (ILD) oxide layers because of its superior gap filling capability. Generally, both sputtering and deposition take place simultaneously, resulting in a deposition/sputter ratio (D/S) ratio that may be adjusted according to process parameters. In an HDP-CVD deposition process, for example, a bias power is coupled to the semiconductor wafer to attract ions which sputter (etch) the wafer during deposition (re-sputtering effect), thereby preventing a phenomena known as crowning where the deposition material converges over the trench before an etched feature opening is completely filled with the deposition material. The deposition rate may therefore be more finely tuned to improved CVD deposition properties to, for example, avoid crowning.

The D/S (deposition-sputtering rate ratio) is a commonly used measure of the gap-filling capability of the process. Among the disadvantages of a lower D/S ratio include the possibility of "corner clipping" or "edge erosion" along the edges of metal lines and the lowering of processing throughput since it requires a relatively longer period of time to achieve the formation of the HDP-CVD oxide. The high density of the plasma can result in significant heating of the wafer during deposition requiring a cooled wafer chuck to cool the wafer during deposition. Generally, higher sputtering rates (lower D/S ratios) tend to increase the temperature of the wafer substrate and as such high temperatures have been necessary at the early stages of gap filling when low deposition/sputter ratios (typically less than 4) are necessary to fill the high aspect ratio channels. Temperatures as high as 400° C. have been observed and at these temperatures significant distortion of the metal features and circuitry have been observed.

On the other hand, a relatively higher D/s ratio results in problems with gap-filling ability leading to the formation of voids. Consequently, many HDP processes according to the prior art have tended to optimize the HDP-CVD process whereby the D/S ratio is carried out at lower levels, for example, about 3.0 and higher temperatures, for example up to about 400° C. in a one step process in order to maximize gap-filling ability.

For example, shown in FIG. 1A is a cross-sectional representation of a portion of a multi-level semiconductor device showing metal lines e.g., 12A, 12B, 12C, 12D surrounded by an HDP-CVD deposited oxide 14 forming a inter-level dielectric layer (ILD). One problem with the prior art methods for forming an HDP-CVD ILD has been the build-up of stresses in the semiconductor wafer as HDP-CVD layers are added. Contributing to the stress build-up are thermal mismatches between materials, for example, the HDP-CVD oxide 14 and the metal lines, during HDP-CVD deposition processes carried out at temperatures of, for example up to 400° C. During the deposition, variations in temperature may occur prior to, during, or following deposition leading to thermally induced stresses. Conceptually shown in FIG. 1A is a void, e.g., 16 formed in the metal line 12 following a typical HDP-CVD process where the deposition is carried out with one-step process where the deposition is completed primarily at one deposition temperature. For example, it has been found that a one-step HDP-CVD deposition process produces metal void defects e.g., 16, are formed near the metal-oxide interfaces, for example in the sidewall areas e.g., 16B of the metal lines.

Referring to FIG. 1B is shown an exemplary HDP-CVD one step deposition process according to the prior art. In FIG. 1B is shown a portion of a temperature profile during HDP-CVD oxide deposition over a semiconductor wafer substrate according to a typical one step HDP-CVD process. The wafer surface temperature was monitored by a conventional IR sensor during HDP-CVD deposition of HDP oxide in a commercially available Applied Materials Corporation Model Ultima HDP-CVD apparatus. Following the temperature profile shown by data line A, where temperature is indicated on the vertical axis and time on the horizontal axis, the wafer temperature initially rises from a temperature level near 270° C. at position 11A to a temperature of near 340° C. where it reaches a stable deposition temperature plateau over which deposition takes as indicated around the area indicated at e.g., position 11B. According to this standard HDP-CVD one step deposition procedure of the prior art, temperature differentials of up to about 70° C. occur between, for example, the lowest temperature near position 11A and the stable deposition temperature near position 11B. According to this process metal void defects similar to that shown in FIG. 1A at e.g., 16, are present.

As a result of the metal void defects found according to a one step HDP-CVD processing of the prior art, electrical properties and reliability of the metal interconnects is compromised increasing parasitic electrical effects and increasing the probability of device failure due to, for example, electromigration effects.

There is therefore a need in the semiconductor processing art to develop an HDP-CVD process whereby metal void defects are avoided or reduced.

It is therefore an object of the invention to provide an improved HDP-CVD processing method to avoid or reduce the formation of metal void defects while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method of reducing stress induced defects in a substrate according to an HDP-CVD process.

In a first embodiment according to the present invention, the method includes providing a substrate for depositing a layer of material according to an HDP-CVD process; igniting a plasma for carrying out an HDP-CVD process; adjusting plasma operating parameters to achieve a first deposition-sputter ratio with respect to the substrate; depositing a first portion of the layer of material according to a first range of substrate temperatures; and, depositing at least a second portion of the layer of material according to at least a second range of substrate temperatures.

These and other embodiments, aspects and features of the invention will be better understood from a detailed description of the preferred embodiments of the invention which are further described below in conjunction with the accompanying Figures.

BRIEF DESCRIPTION OF THE DRAWINGS

FIG. 1A is a representation of a cross sectional side view of a portion of a semiconductor wafer including a portion of an ILD layer with metal interconnect lines according to the prior art.

FIG. 1B is a data representation of a semiconductor surface temperature profile versus time according to an HDP-CVD deposition process according to the prior art.

FIG. 2A is a data representation of a semiconductor surface temperature profile versus time according to one embodiment of the present invention.

FIG. 2B is a data representation of a semiconductor surface temperature profile versus time according to a preferred embodiment of the present invention.

FIG. 3 is a process flow diagram according to one embodiment of the present invention.

DETAILED DESCRIPTION OF THE PREFERRED EMBODIMENTS

According to the present invention an HDP-CVD processing method is presented to avoid or reduce the formation of voids, for example, at the oxide-metal interface in metal wiring interconnects in a multi-layer semiconductor device. It has been found according to the present invention that the formation of metal void defects in metal interconnect wiring can be avoided or reduced by a multi-step HDP-CVD process whereby a multi-step deposition process is carried out including cooling steps between deposition processes.

In an exemplary semiconductor manufacturing process an insulating ILD layer, also referred to as a gap filling layer, is formed of, for example, undoped silicon dioxide glass (USG). Insulating layers composed of this type of material can be applied to semiconductor wafer surfaces by an HDP-CVD deposition method using, for example, electron cyclotron resonance (ECR) or inductively coupled plasma (ICP) deposition.

Prior to forming the ILD layer, closely spaced metal interconnect lines, for example less than 0.25 microns, are formed on a semiconductor substrate (e.g., single crystal silicon) or an optional TiN layer, typically by photolithographic means. Metal line widths and spacings are typically less than about 0.25 micron. The height of the lines can be between 0.3 microns and 1.2 microns. The aspect ratio of these metal lines will typically be greater than about 2. The metal interconnect lines may be composed of any metallic substance that can transmit electrical current, for example aluminum and its alloys and copper and its alloys.

As discussed in the background, the HDP-CVD processing methods of the prior art have been found to produce metal void defects at the oxide-metal interface of semiconductor features including metal interconnect lines. It is believed that the formation of the metal voids is caused by thermally induced stresses related to the HDP-CVD processing methods according to the prior art. It has been unexpectedly found that a multi-step deposition process including a first range of deposition temperatures to form a portion of an oxide layer and at least a at least a second range of deposition temperatures to form at least a second portion of the oxide layer may advantageously be used to avoid or reduce the formation of the metal void defects.

According to one embodiment of the present invention a multi-step HDP-CVD deposition is preferably carried out at temperature ranges of less than about 350° C. Preferably, in order to reduce the overall period that the semiconductor wafer is maintained at higher temperatures during deposition and to reduce stresses caused by temperature differentials, one or more deposition steps subsequent to a first deposition step are carried out including a cooling step interposed between depositions. Preferably, a temperature differential between a maximum deposition temperature and a minimum cooling temperature is less than about 70° C.

In another embodiment, the second and subsequent depositions are carried out at a relatively lower temperature range, for example, between about 270° C. and 340° C., more preferably between about 270° C. and about 320° C. Preferably, the one or more deposition steps subsequent to the first deposition step are performed at a higher D/S ratio compared to a first deposition step thereby lowering a deposition temperature range. The D/S ratio is defined herein as equal to the (net deposition rate)+(blanket sputtering rate) divided by the (blanket sputtering rate).

In one embodiment, the D/S ratio in the first deposition step is carried out at a D/S ratio of about 2.8 to about 3.2 in order to adequately fill high aspect ratio channels. In a second deposition step the D/S ratio is increased to about 5.6 to about 6.2, more preferably about 6.0 such that the gap-filling ability of the deposition is sufficiently maintained without the formation of keyholes or gaps in the ILD layer between metal lines.

In another embodiment of the present invention, cooling periods are interposed between deposition steps. Preferably, cooling periods, for example, from about 10 to about 40 seconds are interposed such that the semiconductor wafer temperature remains higher than about 260° C., more preferably about 270° C. Preferably, the temperature differentials occurring during an interposed cooling period are such that a temperature differential occurring between a minimum cooling temperature and a maximum deposition temperature is less than about 70° C., more preferably less than about 50° C. The term "deposition temperature" herein is defined as the semiconductor wafer surface temperature over which deposition occurs at a given D/S ratio.

It will be appreciated that more than two deposition steps may take place, for example, carrying out a first step at a D/S ratio of about 2.8 to about 3.2, followed by a second deposition step at about 4.3 to about 4.5 and a third deposition at a D/S ratio of about 5.6 to about 6.0, as long as the deposition gap filling abilities are sufficient to avoid the formation of keyholes or gaps in the ILD layer. Preferably, cooling steps take place between deposition steps such that the temperature differentials between cooling temperature minima and deposition temperature maxima for deposition steps following the first deposition step are less than about 50° C.

It will be appreciated that additional methods to reduce temperature differentials present in a semiconductor wafer during HDP-CVD process according to the present invention may also be used alone or in combination with a variation of the D/S ratio. For example, altering the heating cooling rate of the semiconductor wafer by altering a heat transfer rate from the semiconductor wafer back surface to a heat transfer fluid may be used alone or in combination with adjusting a D/S ratio in deposition steps of a multi-step process. For example, a heat exchange fluid may be applied in heat exchange relationship to the back of the semiconductor wafer (substrate) at selected times to reduce a temperature differential caused by deposition or cooling periods including temperature differentials over the thickness of the semiconductor wafer. For example, a wafer chuck with a heat exchange surface may have heat exchange fluid pumped through the heat exchange surface at selected times, for example, during a period of increasing or decreasing wafer (substrate) temperature to minimize a temperature differential between a cooling minima and a deposition maxima. For example, during a cooling period, heat exchange fluid may be pumped at a lower rate through the heat exchange surface to decrease heat transfer through the back surface of the wafer to minimize a temperature differential. For example, an automated temperature sensing means, for example, an IR detector, for sensing a surface wafer temperature and a temperature sensing means for sensing a backside wafer temperature may be used in communication with a controller that controls a heat transfer fluid flow to minimize a temperature differential both across a thickness of a substrate or between deposition steps.

In another embodiment of the multi-step HDP-CVD deposition method according to the present invention, the first deposition is carried out at a D/S ratio of about 2.8 to about 3.4 for a period of time sufficient to deposit more than about half of the HDP-CVD layer. Alternatively, a first deposition step is carried out at a D/S ratio of about 2.8 to about 3.4 for more than about half the period of time it takes to deposit an oxide layer at a selected D/S ratio. It will be appreciated that the deposition time will vary with desired oxide thickness and particular operating characteristics of the HDP-CVD apparatus. For example, in an exemplary embodiment, the deposition may take from about 60 to about 90 seconds at a D/S ratio of about 3.2.

It will also be appreciated by those skilled in the art that several parameters may be adjusted to alter a D/S ratio including a wafer biasing power, a pressure, a flow rate and an RF power. For example, the plasma operating parameters according to the present invention may include, for example, pressures from about 1 mTorr to about 1 Torr and preferably from about 2.5 mTorr to about 100 mTorr while the RF power applied may be selected within a range of about 100 W to about 5,000 W, and preferably within a range of about 1,500 W to about 4,000 W.

Exemplary depositions are shown in FIGS. 2A–2B to illustrate deposition approaches including one embodiment according to the present invention.

Referring to FIG. 2A, is shown a portion of a temperature profile during HDP-CVD oxide deposition over a semiconductor wafer substrate carried out under similar plasma deposition parameters including RF power, wafer bias, pressure and flow rates as for the one-step deposition process of the prior art shown in FIG. 1B including a D/S ratio of about 3.2. The temperature was monitored by a conventional IR sensor during HDP-CVD deposition of HDP oxide in a commercially available Applied Materials Corporation Model Ultima HDP-CVD apparatus.

In one embodiment of the present invention, according to the HDP-CVD deposition process shown in FIG. 2A, a cooling period is added for a two-step deposition process. Referring to FIG. 2A, the temperature profile of the semiconductor wafer deposition surface indicated by data line C rises from about 270° C. at position 22A to a stable deposition temperature of about 340° C. indicated around position 22B after which it is cooled to about 270° C. indicated around position 22C. Following the cooling period, the temperature again increases according to a D/S ratio of about 3.2 to a stable deposition temperature of about 340° C. indicated around position 22D to complete the oxide layer deposition process. Temperature differentials between a maximum deposition temperature and a minimum cooling temperature of up to about 70° C. are similar to the temperature differentials present in the one step process of the prior art. It was found that a multi-step procedure where a cooling step is added, but depositions are carried out at the same D/S ratios in both steps, and therefore having similar temperature differentials between deposition and cooling temperatures, reduces but is not fully effective in avoiding the metal void defects present at the metal line-HDP oxide interfaces as exemplified in FIG. 1A.

Referring to FIG. 2B, is shown an exemplary preferred embodiment of a multi-step process according to the present invention. In a first step, the deposition process is carried out for a period of time under typical plasma conditions using a deposition/sputter (D/S) ratio of about 3.2. During the first deposition step, the temperature increases from about 270° C. around position 24A to reach a stable deposition temperature of about 340° C. at around position 24B. The wafer is then allowed to cool in a cooling step for a period of time to about 270° C. shown around position 24C. In a second deposition step, the D/S ratio is increased to about 6.0 and the wafer surface reaches a deposition temperature of about 315° C. shown around position 24D.

Thus, in an exemplary process, the semiconductor wafer (substrate) experienced a temperature differential of less than about 70° C. between a cooling temperature minimum and a deposition temperature maximum. In the second deposition step a temperature differential of less than about 50° C. occurs between a minimum cooling temperature and maximum deposition temperature of the second deposition step. Thus, it has been unexpectedly found, according to an exemplary multi-step HDP-CVD process of the present invention, that metal void defects are not detected where a first deposition step is carried out over a first range of temperatures and a second deposition carried out over a second range of temperatures relatively lower than the first range of temperatures at an increased DIS ratio whereby a deposition temperature and a temperature differential between a cooling step and a deposition step are reduced.

Referring to FIG. 3 is a process flow diagram showing preferred embodiments of the present invention. In process 301 a first HDP-CVD deposition step is carried out over a first temperature range, preferably less than about 350° C. at a D/S ratio of preferably about 2.8 to about 3.4. In process 303, a cooling period is added such that a temperature differential between a maximum first deposition temperature and a minimum cooling temperature is preferably less than about 70° C. In process 305 a subsequent deposition is carried out at the same, or preferably a relatively lower temperature range compared to the first deposition temperature range, the subsequent deposition carried out at the same, or preferably a relatively higher D/S ratio up to about 6.0. Preferably the temperature differential between a minimum cooling temperature and a deposition temperature is less than about 70° C., more preferably less than about 50° C. Optionally, subsequent depositions may be carried out as indicated by process direction arrow 307, preferably including a temperature differential between of less than 70° C., more preferably less than about 50° C. between a maximum deposition temperature in and a minimum cooling temperature. Further, subsequent deposition steps are preferably carried out at the same or higher D/S ratios included in the second deposition step, preferably up to a deposition ratio of about 6.0.

It has thus been found, as exemplified by the above embodiments, that the metal void defects can be reduced or avoided by a multi-step deposition process including increasing a D/S ratio and reducing temperature differentials present between cooling and deposition processes. It is believed that thermally induced stresses caused by different cooling rates over a thickness of a substrate including thermal mismatches between materials in the substrate such as thermal conductivities and coefficients of thermal expansion contribute to the formation of the metal void defects. Although the exact mechanism is not fully understood, it is believed the thermally induced stresses lead to the formation of the metal void defects at metal-oxide interfaces.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method of reducing stress induced defects in a substrate according to an HDP-CVD process comprising the steps of:
   providing a substrate for depositing a layer of material according to an HDP-CVD process;
   igniting a plasma for carrying out an HDP-CVD process;
   adjusting plasma operating parameters to achieve a first deposition-sputter ratio with respect to the substrate;
   depositing a first portion of the layer of material according to a first range of substrate temperatures; and
   depositing at least a second portion of the layer of material according to at least a second range of substrate temperatures wherein said at least a second range of substrate temperatures is relatively lower than said first range of substrate temperatures.

2. The method of claim 1, wherein the step of depositing at least a second portion includes increasing a deposition-sputter ratio.

3. The method of claim 2, wherein the deposition-sputter ratio is increased from an initial deposition-sputter ratio of about 2.8 to about 3.4 to a deposition ratio of less than about 6.2.

4. The method of claim 1, wherein a cooling step is added between the steps of depositing a first portion and depositing at least a second portion.

5. The method of claim 4, wherein the cooling step includes a cooling temperature such that a temperature differential relative to a first range of substrate temperatures and the at least a second range of substrate temperatures is less than about 70 degrees Centigrade.

6. The method of claim 5, wherein the temperature differential is maintained by the adjustment of at least one of a deposition-sputter ratio and application of a heat exchange fluid in thermal exchange relationship with the substrate.

7. The method of claim 4, wherein the cooling step includes a cooling temperature such that a temperature differential relative to the at least a second range of substrate temperatures is less than about 50 degrees Centigrade.

8. The method of claim 4, wherein the cooling step is over a time period of from about 10 seconds to about 40 seconds.

9. The method of claim 1, wherein the first range of substrate temperatures is less than about 350 degrees Centigrade and the at least a second range of substrate temperatures is between about 310 degrees Centigrade and about 340 degrees Centigrade.

10. The method of claim 9, wherein a cooling step is interposed between the first range of substrate temperatures and the at least a second range of substrate temperatures.

11. The method of claim 10, wherein the cooling step includes a minimum cooling temperature of not less than about 260 degrees Centigrade.

12. A method of reducing stress induced defects present in a semiconductor wafer following an HDP-CVD process comprising the steps of:
   providing a semiconductor wafer for depositing a layer of material according to an HDP-CVD process;
   depositing a first portion of the layer of material over a first range of deposition temperatures according to a first deposition-sputter ratio;
   cooling the semiconductor wafer; and
   depositing at least a second portion of the layer of material over at least a second range of deposition temperatures according to at least a second deposition-sputter ratio.

13. The method of claim 12, wherein the at least a second range of deposition temperatures is relatively lower than the first range of deposition temperatures.

14. The method of claim 12, wherein the at least a second deposition-sputter ratio is relatively higher than the first deposition sputter ratio.

15. The method of claim 14, wherein the first deposition-sputter ratio is between about 2.8 to about 3.4 and the at least a second deposition-sputter ratio is less than about 6.2.

16. The method of claim 12, wherein the step of cooling includes a minimum cooling temperature such that a temperature differential between the minimum cooling temperature and the at least a first range of deposition temperatures is less than about 70 degrees Centigrade.

17. The method of claim 12, wherein the step of cooling includes a minimum cooling temperature such that a temperature differential between the minimum cooling temperature and the at least a second range of deposition temperatures is less than about 50 degrees Centigrade.

18. The method of claim 12, wherein the first range of deposition temperatures is less than about 350 degrees Centigrade and the at least a second range of deposition temperatures is between about 310 degrees Centigrade and about 340 degrees Centigrade.

19. The method of claim 12, wherein the step of cooling includes a minimum cooling temperature of not less than about 260 degrees Centigrade.

20. The method of claim 12, wherein the cooling step and the depositing at least a second portion are sequentially repeated.

* * * * *